United States Patent
Nishimiya et al.

(10) Patent No.: US 8,835,253 B2
(45) Date of Patent: *Sep. 16, 2014

(54) PHOTOELECTRIC CONVERSION DEVICE FABRICATION METHOD AND PHOTOELECTRIC CONVERSION DEVICE

(75) Inventors: Tatsuyuki Nishimiya, Nagasaki (JP); Kazutaka Uda, Nagasaki (JP); Kohei Kawazoe, Nagasaki (JP); Tomoyoshi Baba, Nagasaki (JP); Takashi Ishide, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 760 days.

This patent is subject to a terminal disclaimer.

(21) Appl. No.: 13/054,858

(22) PCT Filed: Oct. 2, 2009

(86) PCT No.: PCT/JP2009/067250
§ 371 (c)(1), (2), (4) Date: Jan. 19, 2011

(87) PCT Pub. No.: WO2010/052982
PCT Pub. Date: May 14, 2010

(65) Prior Publication Data
US 2011/0126894 A1    Jun. 2, 2011

(30) Foreign Application Priority Data
Nov. 5, 2008    (JP) .................................. 2008-284208

(51) Int. Cl.
| H01L 21/00 | (2006.01) |
| H01L 31/18 | (2006.01) |
| H01L 31/077 | (2012.01) |
| H01L 31/0392 | (2006.01) |
| H01L 31/20 | (2006.01) |

(52) U.S. Cl.
CPC .......... H01L 31/1804 (2013.01); H01L 31/182 (2013.01); *Y02E 10/546* (2013.01); *Y02E 10/547* (2013.01); H01L 31/1824 (2013.01); H01L 31/077 (2013.01); H01L 31/03921 (2013.01); *Y02E 10/545* (2013.01); H01L 31/202 (2013.01)
USPC ...................................................... 438/257

(58) Field of Classification Search
CPC .................................................. H01L 27/1423
USPC .................. 438/57, 66, 96, 98; 136/258, 259
See application file for complete search history.

(56) References Cited

U.S. PATENT DOCUMENTS

| 4,650,524 A | 3/1987 | Kiyama et al. |
| 4,734,550 A | 3/1988 | Imamura et al. |

(Continued)

FOREIGN PATENT DOCUMENTS

| EP | 0 536 431 A1 | 4/1993 |
| JP | 61006828 | 1/1986 |

(Continued)

OTHER PUBLICATIONS

English Machine Translation of JP 200261308 A.*

(Continued)

*Primary Examiner* — Brook Kebede
(74) *Attorney, Agent, or Firm* — Manabu Kanesaka; Benjamin J. Hauptman

(57) ABSTRACT

Provided is a photoelectric conversion device fabrication method in which current leakage from an intermediate contact layer via an intermediate-contact-layer separating groove is prevented as much as possible. Included are a step of film-forming a top layer having amorphous silicon as a main component; a step of film-forming, on the top layer, an intermediate contact layer electrically and optically connected thereto; a step of separating the intermediate contact layer by removing the intermediate contact layer by irradiating it with a pulsed laser, forming an intermediate-contact-layer separating groove that reaches the top layer; and a step of film-forming, on the intermediate contact layer and inside the intermediate-contact-layer separating groove, a bottom layer electrically and optically connected thereto and having microcrystalline silicon as a main component. A pulsed laser having a pulse width of 10 ps to 750 ps, inclusive, is used as the pulsed laser for separating the intermediate contact layer.

2 Claims, 6 Drawing Sheets

(56) References Cited

U.S. PATENT DOCUMENTS

| | | | |
|---|---|---|---|
| 4,970,368 A | 11/1990 | Yamazaki et al. | |
| 5,072,091 A | 12/1991 | Nagata et al. | |
| 5,296,674 A | 3/1994 | Praschek et al. | |
| 5,864,430 A | 1/1999 | Dickey et al. | |
| 5,880,430 A | 3/1999 | Wein | |
| 5,932,118 A | 8/1999 | Yamamoto et al. | |
| 2002/0066478 A1* | 6/2002 | Hayashi et al. | 136/244 |
| 2003/0172967 A1 | 9/2003 | Tachibana et al. | |
| 2005/0067392 A1 | 3/2005 | Nagai et al. | |
| 2006/0261050 A1 | 11/2006 | Krishnan et al. | |
| 2007/0062919 A1 | 3/2007 | Hamada et al. | |
| 2007/0169805 A1 | 7/2007 | Sasaki et al. | |
| 2007/0272668 A1 | 11/2007 | Albelo et al. | |
| 2008/0110491 A1 | 5/2008 | Buller et al. | |
| 2008/0178925 A1 | 7/2008 | Wu et al. | |
| 2009/0272429 A1 | 11/2009 | Lu et al. | |
| 2010/0059109 A1 | 3/2010 | Nakayashiki et al. | |
| 2011/0203630 A1 | 8/2011 | Takano et al. | |

FOREIGN PATENT DOCUMENTS

| | | |
|---|---|---|
| JP | 62040986 | 2/1987 |
| JP | 63121813 A | 5/1988 |
| JP | 582816 A | 4/1993 |
| JP | 5218472 | 8/1993 |
| JP | 727994 A | 1/1995 |
| JP | 8330617 | 12/1996 |
| JP | 10258385 A | 9/1998 |
| JP | 2001-274447 A | 10/2001 |
| JP | 2001274447 | 10/2001 |
| JP | 2002261308 | 9/2002 |
| JP | 2002261308 A * | 9/2002 |
| JP | 2003273383 A | 9/2003 |
| JP | 2003298089 A | 10/2003 |
| JP | 200538907 A | 2/2005 |
| JP | 2005-101413 A | 4/2005 |
| JP | 200599858 A | 4/2005 |
| JP | 2005101412 | 4/2005 |
| JP | 2005101413 | 4/2005 |
| JP | 200680205 A | 3/2006 |
| JP | 2006110587 A | 4/2006 |
| JP | 2006313872 | 11/2006 |

OTHER PUBLICATIONS

A Decision to Grant which issued on Dec. 5, 2012 in corresponding Chinese Patent Application No. 200980129037.1 (Chinese Language).

A Decision to Grant which issued on Dec. 5, 2012 in corresponding Chinese Patent Application No. 200980129037.1 (English Language).

A Chinese Office Action dated May 30, 2012 in Chinese Application No. 200980129037.1.

Decision to Grant a Patent mailed Dec. 18, 2012, corresponds Japanese patent application No. 2008-284209.

Notification of Grant Invention Patent issued Aug. 30, 2013, corresponds Chinese patent application No. 200980128810.2.

International Search Report for PCT/JP2009/067250 mailed Dec. 15, 2009.

* cited by examiner

PHOTOELECTRIC CONVERSION DEVICE FABRICATION METHOD AND PHOTOELECTRIC CONVERSION DEVICE

RELATED APPLICATIONS

The present application is a national phase of PCT/JP2009/067250, filed Oct. 2, 2009 and is based on, and claims priority from, Japanese Application Number 2008-284208, filed Nov. 5, 2008.

TECHNICAL FIELD

The present invention relates to fabrication methods for photoelectric conversion devices, for example, thin-film solar cells, and to photoelectric conversion devices, and in particular, relates to a photoelectric conversion device fabrication method including a step in which an intermediate contact layer is separated with a pulsed laser.

BACKGROUND ART

In the related art, there is a known structure in which a plurality of photoelectric conversion layers are laminated in order to improve the photoelectric conversion efficiency of a thin-film solar cell. For example, a tandem solar cell in which an amorphous silicon layer and a microcrystalline silicon layer are laminated is known. This tandem solar cell is formed by sequentially laminating a transparent electrode, an amorphous silicon layer, a microcrystalline silicon layer, and a back electrode on a light-transmitting substrate. There is a known technique for achieving a further improvement in photoelectric conversion efficiency by providing, between the amorphous silicon layer and the microcrystalline silicon layer, an intermediate contact layer that is electrically and optically connected thereto, causing part of the incident light to be reflected.

Such a tandem solar cell increases the voltage to obtain the desired voltage by connecting a plurality of photoelectric conversion cells in series. When a plurality of photoelectric conversion cells are connected in series, the back electrode and the transparent electrode are connected by forming a connecting groove that penetrates the amorphous silicon layer, the intermediate contact layer, and the microcrystalline layer, and this connecting groove is filled with the back electrode.

On the other hand, because the intermediate contact layer exhibits conductivity, when it is electrically connected to the connecting groove, which is filled with the back electrode, the electrical current generated in the amorphous silicon layer and the microcrystalline layer leaks to the connecting groove via the intermediate contact layer.

Thus, a technique for preventing current leakage from the intermediate contact layer to the connecting groove by separating the intermediate contact layer by means of laser processing has been proposed (see PTL 1 and PTL 2).

CITATION LIST

Patent Literature

{PTL 1} Japanese Unexamined Patent Application, Publication No. 2002-261308
{PTL 2} Japanese Unexamined Patent Application, Publication No. 2006-313872

SUMMARY OF INVENTION

Technical Problem

However, even when the intermediate contact layer is separated by laser processing, there is still a risk of current leakage from the intermediate contact layer, for the following reasons.

When the intermediate contact layer and the amorphous silicon layer are irradiated with laser light while separating the intermediate contact layer, the amorphous silicon layer absorbs the thermal energy of the laser, and the amorphous silicon layer is melted and ablated together with the intermediate contact layer, thus forming an intermediate-contact-layer separating groove. During formation of this intermediate-contact-layer separating groove, the melted amorphous silicon layer recrystallizes at wall portions (including the bottom wall) forming the intermediate-contact-layer separating groove. Because this recrystallized region is transformed from initially amorphous silicon, it is thought to have a lower resistance. The recrystallized region whose resistance is lowered in this way serves as a new flow path for the current, which ultimately reduces the performance of the cell.

From extensive testing by the inventors, one cause of this was determined; namely, it stems from use of a pulsed laser having nanosecond-order pulse width for the laser processing. The reason is that, because the time interval is comparatively long with a nanosecond-order pulse width, thermal diffusion occurs to the wall portions forming the intermediate-contact-layer separating groove, and an excessive recrystallization region is formed in the wall portions.

The present invention has been conceived in light of these circumstances, and an object thereof is to provide a photoelectric conversion device fabrication method and a photoelectric conversion device in which current leakage from the intermediate contact layer via the intermediate-contact-layer separating groove can be prevented as much as possible.

Solution to Problem

In order to solve the problems described above, the photoelectric conversion device fabrication method and the photoelectric conversion device of the present invention employ the following solutions.

Specifically, in a photoelectric conversion device fabrication method according to an aspect of the present invention, which includes a first photoelectric conversion layer film-formation step of film-forming a first photoelectric conversion layer having silicon as a main component; an intermediate contact layer film-formation step of film-forming, on the first photoelectric conversion layer, an intermediate contact layer that is electrically and optically connected to the first photoelectric conversion layer; an intermediate-contact-layer separating step of separating the intermediate contact layer by radiating laser light to remove the intermediate contact layer, forming an intermediate-contact-layer separating groove that reaches the first photoelectric conversion layer; and a second photoelectric conversion layer film-formation step of film-forming, on the intermediate contact layer and inside the intermediate-contact-layer separating groove, a second photoelectric conversion layer having silicon as a main component and being electrically and optically connected to the intermediate contact layer, wherein the intermediate-contact-layer separating step is performed with a pulsed laser having a pulse width of 10 ps to 750 ps, inclusive.

The intermediate contact layer and the first photoelectric conversion layer are melted and ablated by the thermal energy supplied by irradiating them with the laser, thus forming a groove at the laser irradiated portion. Thus, an intermediate-contact-layer separating grove that separates the intermediate contact layer is formed.

In the aspect described above, the pulsed laser pulse width used to separate the intermediate contact layer is set at 10 ps to 750 ps, inclusive, which is substantially shorter than the conventional pulse width of nanoseconds, and the time interval of the thermal energy supplied to the first photoelectric conversion layer is extremely short. Accordingly, because the first photoelectric conversion layer is melted and ablated in an extremely short time interval compared with a laser with a nanosecond pulse width, there is no excessive loss of heat at the wall portions forming the intermediate-contact-layer separating groove. Therefore, in the wall portions forming the intermediate-contact-layer separating groove, a region where silicon is recrystallized can be reduced as much as possible. Because it is possible to reduce a region of low resistance caused by silicon recrystallization in this way, current leakage via the intermediate-contact-layer separating groove can be reduced.

Preferably, an amorphous silicon layer is used as the first photoelectric conversion layer, and a microcrystalline silicon layer is used as the second photoelectric conversion layer. GZO (Ga-doped ZnO) is preferably used as the intermediate contact layer.

In the photoelectric conversion device fabrication method according to an aspect of the present invention, the intermediate-contact-layer separating groove terminates at an intermediate position in the first photoelectric conversion layer.

The intermediate-contact-layer separating groove terminates at an intermediate position in the first photoelectric conversion layer and does not reach the electrode (or another intermediate contact layer) connected to the first photoelectric conversion layer. Accordingly, even if a recrystallization region is formed in the wall portions forming the separating groove, because this recrystallization region does not physically contact the electrode (or intermediate layer), the intermediate contact layer and the electrode are not electrically connected.

The terminating position of the intermediate-contact-layer separating groove is preferably set at a position where the recrystallization region does not make contact with the electrode (or other intermediate contact layer) connected to the first photoelectric conversion layer.

In the photoelectric conversion device fabrication method according to an aspect of the present invention, the intermediate-contact-layer separating step includes a step of forming the intermediate-contact-layer separating groove continuously by partially overlapping a plurality of separating holes, and the overlapping width of neighboring separating holes is 0% to 5%, inclusive, of the diameter of the separating holes.

Because a pulsed laser with a pulse width of 10 ps to 750 ps, inclusive, is used, thermal energy can be supplied to the first photoelectric conversion layer in an extremely short time interval. In other words, compared with a conventional pulsed laser with nanosecond pulse width, thermal diffusion caused by absorption and diffusion of the incident thermal energy at the first photoelectric conversion layer light energy can be reduced; therefore, sufficient thermal energy is made incident as far as the vicinity of the peripheries of the wall portions forming the intermediate-contact-layer separating groove, thus enabling the energy to be used without waste in the groove processing, and it is possible to form separating holes, which are formed to the desired depth, up to the vicinity of the peripheries of the separating holes. Accordingly, it is possible to reduce the overlapping width of neighboring separating holes to 0% to 5%, inclusive, of the diameter of the separating holes, and in addition, it is possible to achieve a higher processing speed.

Here, an overlapping width of neighboring separating holes of 0% means that the neighboring separating holes are touching.

A photoelectric conversion device according to an aspect of the present invention includes a first photoelectric conversion layer having silicon as a main component; an intermediate contact layer electrically and optically connected to the first photoelectric conversion layer; and a second photoelectric conversion layer having silicon as a main component and being electrically and optically connected to the intermediate contact layer, wherein, in the photoelectric conversion device, in which an intermediate-contact-layer separating groove is formed penetrating the intermediate contact layer so as to separate the intermediate contact layer and reaching the first photoelectric conversion layer, the intermediate-contact-layer separating groove is formed continuously by overlapping a plurality of separating holes, and the overlapping width of neighboring separating holes is 0% to 5%, inclusive, of the diameter of the separating holes.

Because the overlapping width of the neighboring separating holes is reduced to 0% to 5%, inclusive, of the diameter of the separating holes, an improvement in processing speed can be achieved.

Here, an overlapping width of neighboring separating holes of 0% means that the neighboring separating holes are touching.

Advantageous Effects of Invention

According to the present invention, because a pulsed laser having a pulse width of 10 ps to 750 ps, inclusive, is used while processing the intermediate-contact-layer separating groove, it is possible to restrict, as much as possible, a silicon recrystallization region occurring in the vicinity of wall portions forming the intermediate-contact-layer separating groove, making it possible to suppress current leakage via the intermediate-contact-layer separating groove. Accordingly, an improvement in the efficiency of the photoelectric conversion device can be realized.

DESCRIPTION OF EMBODIMENTS

Embodiments of the present invention will be described below with reference to the drawings.

Figure 1:
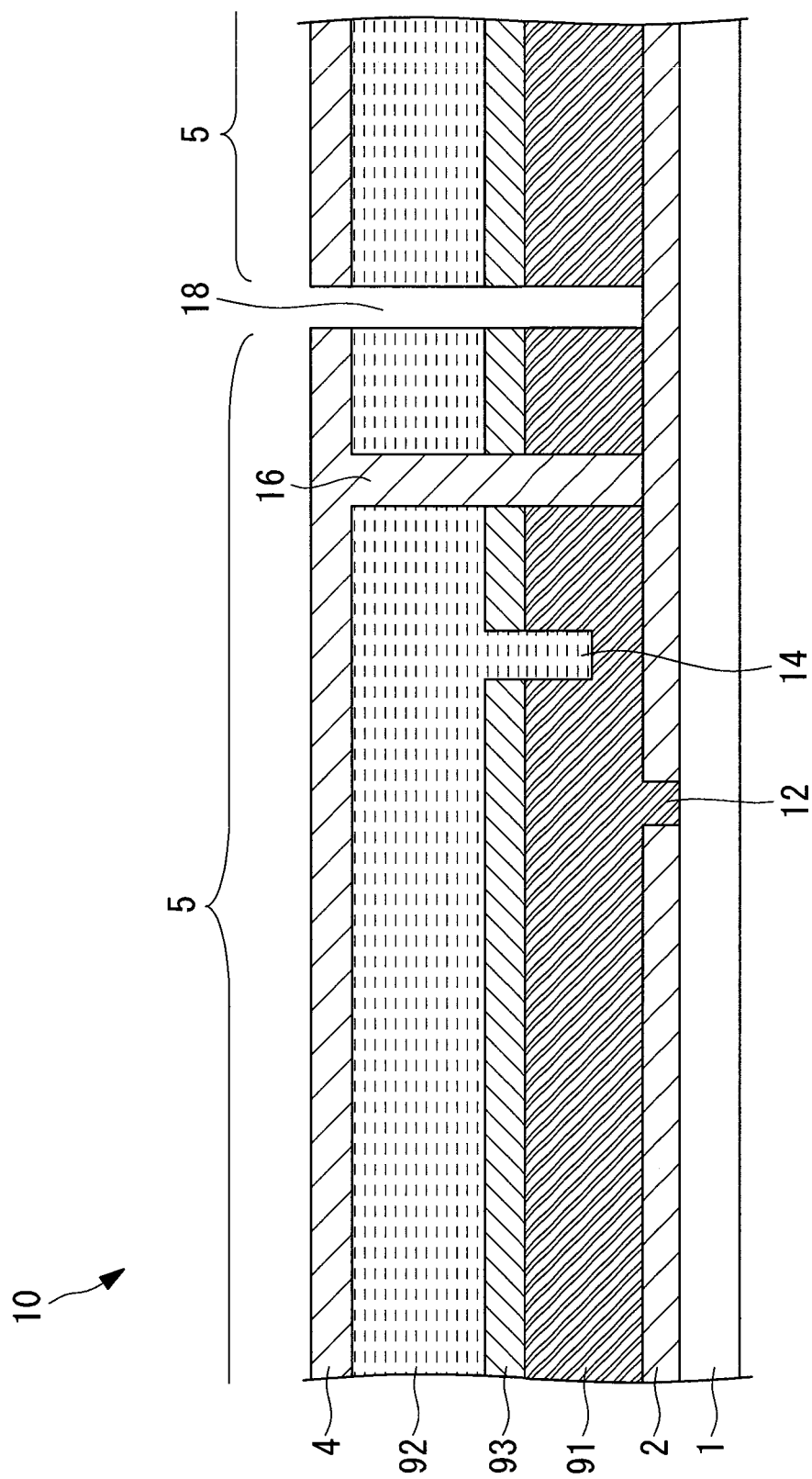
FIG. 1 is a longitudinal sectional view showing a tandem solar cell according to an embodiment of the present invention.

FIG. 1 shows a longitudinal sectional view of a tandem-type silicon thin-film solar cell (photoelectric conversion device).

A solar cell 10 includes a glass substrate (light-transmitting substrate) 1, a transparent electrode layer 2, a top layer (first photoelectric conversion layer) 91, an intermediate contact layer 93, a bottom layer (second photoelectric conversion layer) 92, and a back electrode layer 4. In this embodiment, the top layer 91 is a photoelectric conversion layer containing mainly a noncrystalline silicon semiconductor, and the bottom layer 92 is a photoelectric conversion layer containing mainly a crystalline silicon semiconductor.

Here, "silicon" is a general term including silicon (Si), silicon carbide (SiC), and silicon germanium (Site). In addition, "crystalline silicon" is intended to mean silicon other than amorphous silicon, in other words, noncrystalline silicon, and also includes microcrystalline silicon and polycrystalline silicon.

The solar cell 10 of this embodiment having the above-described structure, is fabricated as follows.

For the glass substrate 1, soda float glass having a surface area of 1 m² or greater is used. Specifically, a substrate having a size of 1.4 m×1.1 m and a thickness of 3.5 to 4.5 mm is used. The end faces of the glass substrate 1 are preferably subjected to corner chamfering or R-chamfering to prevent damage caused by thermal stress, impacts, and so forth.

For the transparent electrode layer 2, a transparent electrode film having, for example, a selenium oxide film ($SnO_2$) as a main component is suitably used. This transparent electrode film, having a film thickness of about 500 nm to 800 nm, is realized by a film-formation process at about 500° C. using a thermal CVD apparatus. During this film-formation process, a texture with suitable asperities is formed on the surface of the transparent electrode film. For the transparent electrode layer 2, an alkali barrier film (not shown) may be interposed between the transparent electrode film and the substrate 1. The alkali barrier film, which is assumed to be a silicon oxide film ($SiO_2$) with a film thickness of, for example, 50 nm to 150 nm, is realized by a film-formation process at about 500° C. using a thermal CVD apparatus.

Thereafter, the glass substrate 1 is placed on an X-Y table and is irradiated with the first harmonic of a YAG laser (1064 nm) from the film surface (the upper side in the drawing) of the transparent electrode layer 2. The laser power is adjusted so as to be appropriate for the processing speed, and the laser light is moved relative to the glass substrate 1, over the transparent electrode layer 2 in a direction perpendicular to the series-connection direction of power generating cells 5 (the direction perpendicular to the plane of the drawing), thus forming a transparent-electrode separating groove 12. Accordingly, the transparent electrode layer 2 is laser etched into rectangles with prescribed widths of about 6 mm to 15 mm.

Next, using a plasma CVD apparatus, under conditions with a low-pressure atmosphere of 30 to 1000 Pa and a substrate temperature of about 200° C., a p thin-film/i thin-film/n thin-film, formed of amorphous silicon, are sequentially formed to form the top layer 91 (first photoelectric conversion layer film-formation step). The top layer 91 is formed on the transparent electrode layer 2 with a process gas in which $SiH_4$ gas and $H_2$ gas are the main materials. The p layer, i layer, and n layer are laminated in this order from the side on which sunlight is incident (the glass substrate 1 side).

In this embodiment, the top layer 91 is formed of mainly B-doped amorphous SiC with a film thickness of 10 nm to 30 nm as the amorphous p layer, mainly amorphous Si with a film thickness of 200 nm to 350 nm as the amorphous i layer, and mainly p-doped Si, in which microcrystalline Si is contained in amorphous Si, with a film thickness of 30 nm to 50 nm, as the amorphous n layer. A barrier layer for improving the interfacial properties may be provided between the p thin-film and the i thin-film.

Next, a GZO (Ga-doped ZnO) film serving as the intermediate contact layer 93 is formed on the top layer 91. The GZO (Ga-doped ZnO) film, having a film thickness of 20 nm to 100 nm, is formed by a sputtering apparatus. By means of the intermediate contact layer 93, the contact properties between the top layer 91 and the bottom layer 92 can be improved, and current consistency can be achieved. The intermediate contact layer 93 is a semi-reflective film which realizes improved photoelectric conversion efficiency in the top layer 91 by reflecting part of the light incident thereon from the glass substrate 1.

Figure 2:
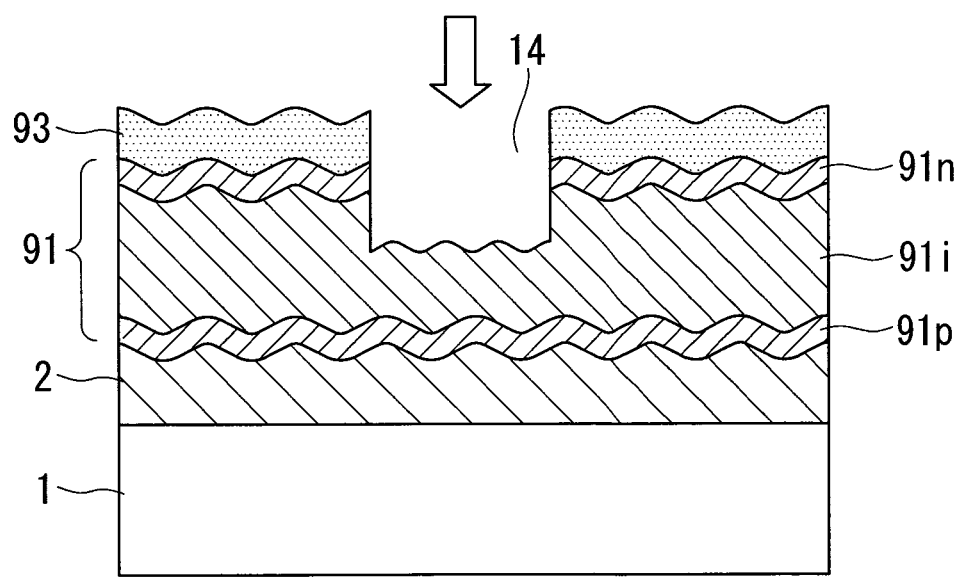
FIG. 2 is a longitudinal sectional view showing a state in which an intermediate-contact-layer separating groove is formed in an intermediate-contact-layer separating step.

Next, the glass substrate 1 is placed on the X-Y table and is irradiated with a pulsed laser having a pulse width of 10 ps to 750 ps (hereinafter referred to as "picosecond pulsed laser") from the film surface side of the transparent electrode layer 2 (the upper side in the figure). With this picosecond pulsed laser, an intermediate-contact-layer separating groove 14 is formed between the transparent-electrode separating groove 12 and a connecting groove 16 (intermediate-contact-layer separating step). As shown in FIG. 2, the intermediate-contact-layer separating groove 14 terminates at the amorphous i layer 91i of the top layer 91. This intermediate-contact-layer separating step is described in detail later.

Next, a microcrystalline p thin-film/microcrystalline i thin-film/microcrystalline n thin-film, formed of microcrystalline silicon thin-films, are sequentially formed on top of the intermediate contact layer 93 and inside the intermediate-contact-layer separating groove 14, with a plasma CVD apparatus under conditions of a low-pressure atmosphere of 3000 Pa or less, a substrate temperature of about 200° C., and a plasma generation frequency of 40 MHz to 100 MHz, forming the bottom layer 92 (second photoelectric conversion layer film-formation step).

In this embodiment, the bottom layer 92 is formed of mainly B-doped microcrystalline SiC with a film thickness of 10 nm to 50 nm as the microcrystalline p layer, mainly microcrystalline Si with a film thickness of 1.2 μm to 3.0 μm as the microcrystalline i layer, and mainly p-doped microcrystalline Si with a film thickness of 20 nm to 50 nm as the microcrystalline n layer.

For the microcrystalline silicon thin-films, it is preferable to set a distance d between the plasma discharge electrode and the surface of the glass substrate at 3 mm to 10 mm, particularly for formation of the microcrystalline i thin-film by the plasma CVD method. When it is less than 3 mm, it becomes difficult to keep the distance d constant because of the precision of individual constituent devices in a film-formation chamber compatible with large substrates, and there is a risk of the discharge becoming unstable when they get too close to each other. When it is more than 10 mm, it is difficult to achieve an adequate film-formation speed (1 nm/s or more), the plasma uniformity decreases, and the film quality is reduced due to ion bombardment.

Next, the glass substrate 1 is placed on the X-Y table and is irradiated with the second harmonic (532 nm) of a laser-diode-pumped YAG laser from the film surface side of the bottom layer 92 (the upper side in the figure), as shown by the arrow in the figure. The laser power is adjusted so as to be appropriate for the processing speed, with a pulse oscillation of 10 to 20 kHz, and the connecting groove 16 is formed at a lateral position about 50 to 350 µm away from the transparent electrode separating groove 12. The laser may be radiated from the glass substrate 1 side, and in this case, because the intermediate contact layer 93 and the bottom layer 92 can be etched using high-pressure vapor generated with the energy absorbed in the top layer 91, it is possible to perform laser etching even more stably. The position of the laser etching line is selected in consideration of the positional tolerance so as not to intersect the etching line in the previous step.

Next, as the back electrode layer 4, an Ag film/Ti film are sequentially formed by a sputtering apparatus with a low-pressure atmosphere, at about 150 to 200° C. For the back electrode layer 4 in this embodiment, an Ag film with a film thickness of about 150 to 500 nm and a Ti layer, having a high anti-corrosion effect and serving to protect the Ag film, with a film thickness of 10 to 20 nm are laminated in this order. Alternatively, a laminated structure of an Ag film having a film thickness of about 25 nm to 100 nm and an Al film having a film thickness of about 15 nm to 500 nm may be used. In order to improve the reflectivity and reduce the contact resistance of the n layer and the back electrode layer 4, a GZO (Ga-doped ZnO) film may be formed between the bottom layer 92 and the back electrode layer 4 to a film thickness of 50 to 100 nm using a sputtering apparatus.

Next, the glass substrate 1 is placed on the X-Y table and is irradiated with the second harmonic (532 nm) of a laser-diode-pumped YAG laser from the glass substrate 1 side (the lower side in the figure). The laser light is absorbed in the top layer 91 and the bottom layer 92, and the back electrode layer 4 is removed by blasting using the high gas vapor pressure generated during this process. The laser power is adjusted so that the processing speed becomes appropriate, with the pulse oscillation frequency of the laser set at 1 to 10 kHz, and laser etching is performed to form a cell separating groove 18 at a position about 250 to 400 µm laterally away from the transparent electrode separating groove 12.

After the step described above, the solar cell is fabricated through steps such as applying a highly water-resistant back sheet to cover the back electrode 4, with an adhesive packing sheet such as EVA (ethylene vinyl acetate copolymer) disposed therebetween.

The above-mentioned intermediate-contact-layer separating step is described in detail below.

The laser used in this step is a picosecond pulsed laser having a pulse width of 10 ps to 750 ps. Specifically, a picosecond pulsed laser with a pulse width of 13 ps, an oscillation frequency of 10 kHz, and a beam spot diameter of 124 µm is preferably used. Representative examples of the picosecond pulsed laser include an Nd:YVO4 laser, a titanium sapphire laser, a fiber laser, etc.

As shown in FIG. 2, the terminating position (bottom) of the intermediate-contact-layer separating groove 14 is located inside the i layer 91$i$ of the top layer 91. In other words, the terminating position of the intermediate-contact-layer separating groove 14 is not located inside the n layer 91$n$ or the p layer 91$p$ of the top layer 91. Thus, even if, by any chance, a recrystallized region of the amorphous silicon is formed at a wall portion (including the bottom portion) forming the intermediate-contact-layer separating groove 14, the dopant in the n layer 91$n$ or the p layer 91$p$ is prevented from diffusing to this recrystallization region, and the recrystallization region can be prevented from having a low resistance due to the dopant. The recrystallization region can be confirmed with a transmission electron microscope etc.

Figure 3:
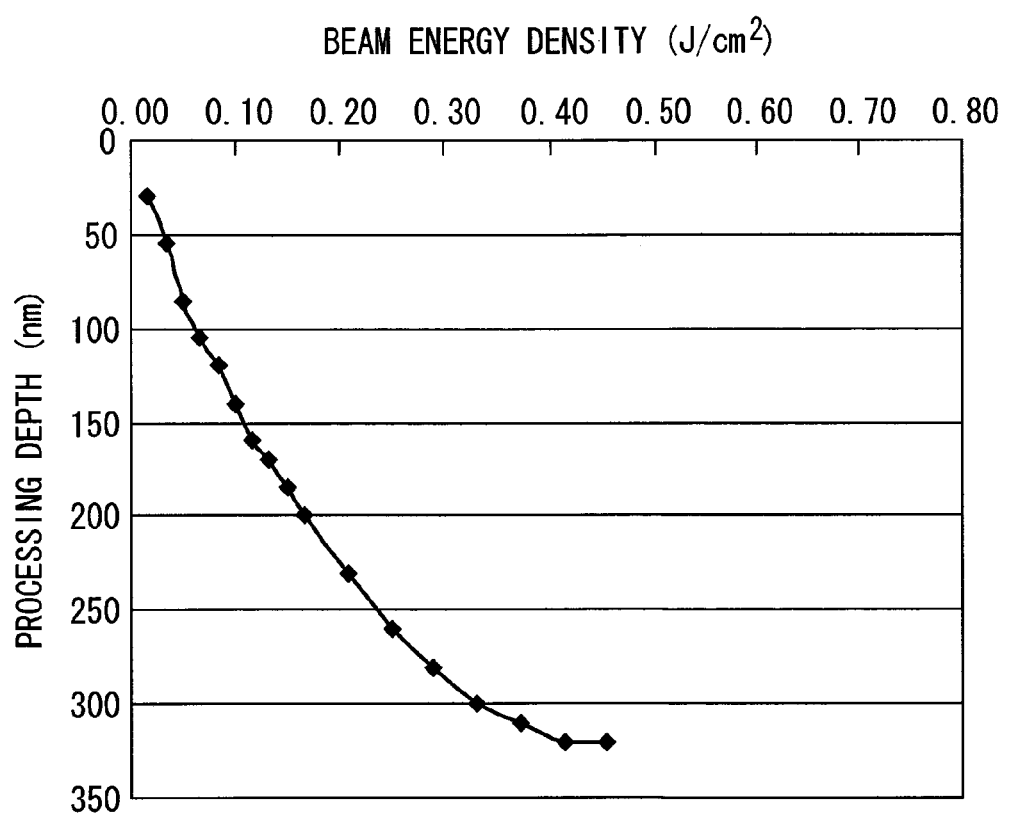
FIG. 3 is a graph showing the relationship between the energy density of a picosecond pulsed laser and processing depth.

As a result of extensive testing, the inventors have found that, with a picosecond pulsed laser, for the silicon material used in this embodiment (more specifically, amorphous silicon), there is a certain relationship between the beam energy density and the processing depth. This relationship is shown in FIG. 3. There is a relationship represented by the quadratic equation:

$$y = -1563.7x^2 + 1377.7x + 15.586 \qquad (1)$$

where y (nm) is the processing depth, and x (J/cm$^2$) is the beam energy density.

Considering that the intermediate contact layer 93 is 70 nm thick, and the top layer 91 is 250 nm thick, a range that penetrates the intermediate contact layer 93 without penetrating the top layer 91, that is, a range of about 100 to 300 nm, is preferable. This range of processing depths is precisely approximated by equation (1).

Figure 4A:
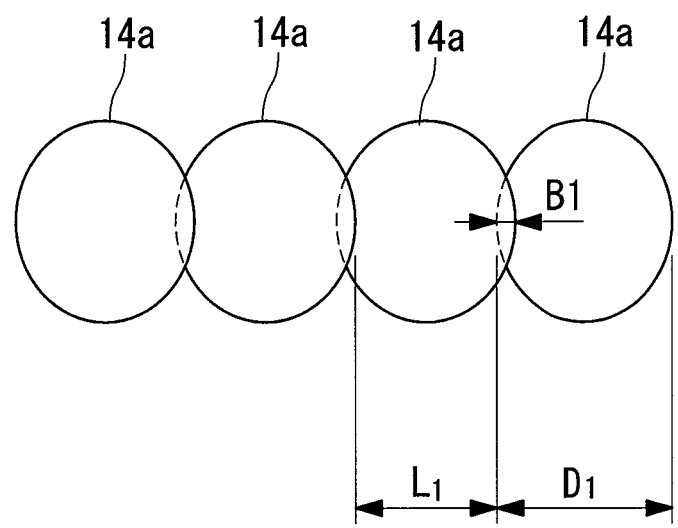
FIG. 4A is a plan view showing overlapping of separating holes in a case where a picosecond pulsed laser according to an embodiment of the present invention is used.

As shown in FIG. 4A, the intermediate-contact-layer separating groove 14 is formed continuously by partially overlapping separating holes 14$a$ having a diameter D1 on the order of the illustrated laser beam spot diameter (for example, 124 µm). The left-right direction in the figure is the direction in which the intermediate-contact-layer separating groove 14 extends.

Figure 5A:
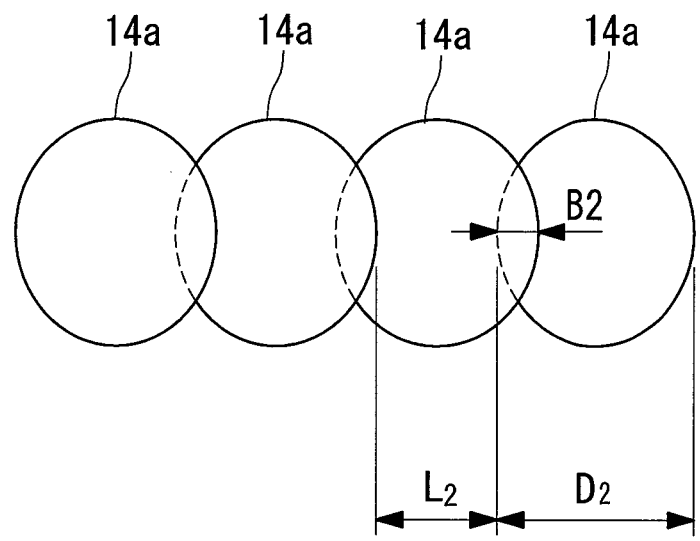
FIG. 5A is a plan view showing overlapping of separating holes in a case where a nanosecond pulsed laser according to a comparative example in the present invention is used.

The overlapping width B1 of neighboring separating holes 14$a$ is from 0% to 5%, inclusive, of the diameter D1 of the separating holes 14$a$. The width that can be processed with a single shot of laser irradiation is proportional to L1 (D1−2*B1); therefore, the processing speed increases as the overlapping width B1 become smaller. In contrast, from testing by the inventors, with a conventional nanosecond-order pulse-width laser (hereinafter referred to as "nanosecond pulsed laser"), the overlapping width B2 (see FIG. 5A) was 10 to 20% of the diameter of the separating holes 14$a$.

The reason why the overlapping width B1 is smaller when using the picosecond laser is as follows.

A description will be given by comparing FIG. 4B, which shows the case of a picosecond pulsed laser of this embodiment, and FIG. 5B, which shows the case of a nanosecond pulsed laser. In each figure, the horizontal axis shows the position centered on the optical axis of the laser, and the vertical axis shows the energy density used in groove processing.

Figure 4B:
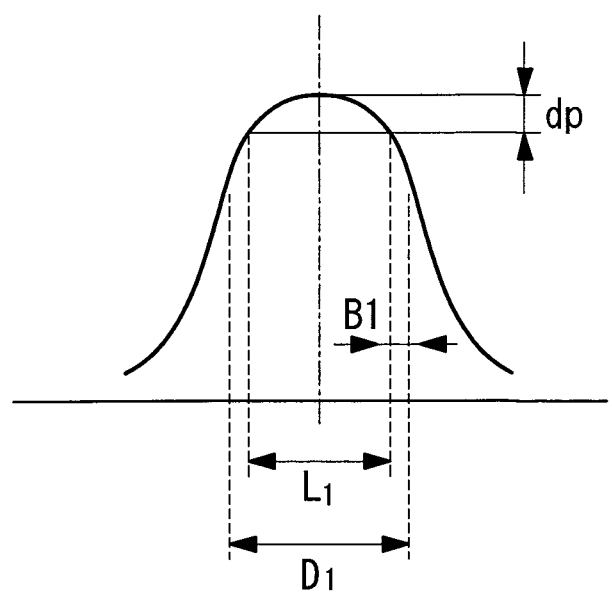
FIG. 4B is a graph showing energy density used in groove processing with a picosecond pulsed laser for a case where a picosecond pulsed laser according to an embodiment of the present invention is used.
Figure 5B:
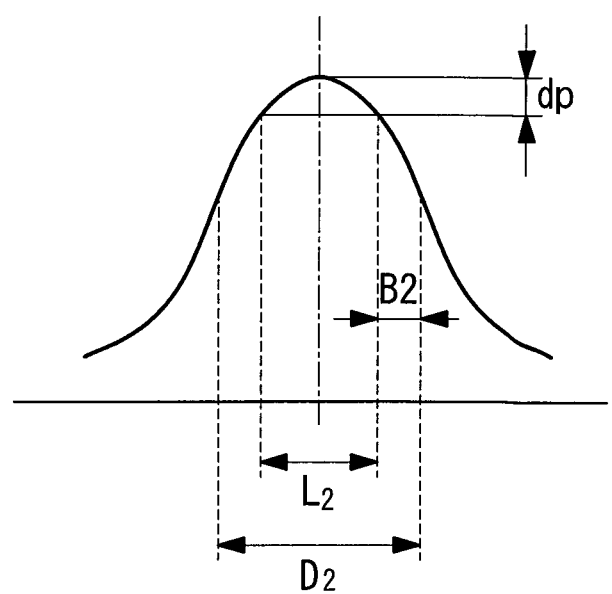
FIG. 5B is a graph showing energy density used in groove processing with a nanosecond pulsed laser for a case where a nanosecond pulsed laser according to a comparative example in the present invention is used.

In both FIG. 4B and FIG. 5B, because the pulsed laser has a Gaussian-distribution energy density centered on the laser optical axis, the incident energy density from the laser used for processing the groove also has a Gaussian distribution. However, as shown in FIG. 5B, because the nanosecond pulsed laser has a longer pulse width than the picosecond pulsed laser, the amount of thermal diffusion caused by the incident energy being absorbed and diffused in the amorphous silicon of the top layer 91 is large. Therefore, the energy density used in groove processing is greatly reduced as the distance from the center of the laser optical axis becomes greater. Thus, the region where the energy density required for processing the groove to the desired depth dp is satisfied is limited to L2 (=D2−2*B2).

In contrast, because the picosecond pulsed laser has a comparatively short pulse width, the time during which the energy is incident from the laser is short, the incident energy is concentrated in a short time, and therefore, the amorphous silicon is instantaneously melted and ablated. Accordingly, it is possible to reduce the amount of thermal diffusion caused by absorption and diffusion in the amorphous silicon of the wall portions. From the above description, the region where the energy density required for processing the groove to the desired depth dp is satisfied is L1 (=D1−2*B1>L2), and it is thus possible to realize a processing width L1 that is larger than the processing width L2 using the nanosecond pulsed laser.

According to this embodiment, described above, the following operational advantages are provided.

With the pulse width of the pulsed laser used while separating the intermediate contact layer 93 set at 10 ps to 750 ps, inclusive, the pulse width is significantly shorter than the conventional pulse width of nanoseconds, and the time interval during which thermal energy is applied to the top layer 91 is extremely short. Accordingly, the amorphous silicon in the top layer 91 can be melted and ablated in an extremely short time interval compared with a laser with a nanosecond pulse width; therefore, excessive heat loss does not occur at the wall portions forming the intermediate-contact-layer separating groove 14. Accordingly, in the wall portions forming intermediate-contact-layer separating groove 14, the region where silicon is recrystallized can be reduced as much as possible. Because it is possible to reduce a region of low resistance caused by silicon recrystallization in this way, current leakage via the intermediate-contact-layer separating groove can be reduced.

The intermediate-contact-layer separating groove 14 terminates at an intermediate position in the top layer 91 and does not reach the transparent electrode layer 2 connected to the top layer 91. Accordingly, even if a recrystallization region is formed in the wall portions forming the intermediate-contact-layer separating groove 14, because this recrystallization region does not physically contact the transparent electrode layer 2, the intermediate contact layer 93 and the transparent electrode layer 2 are not in electrical contact.

Because a pulsed laser with a pulse width of 10 ps to 750 ps, inclusive, is used, thermal energy can be supplied to the top layer 91 in an extremely short time interval. In other words, compared with a conventional pulsed laser with nanosecond pulse width, thermal diffusion caused by absorption and diffusion of the incident thermal energy in the amorphous silicon in the top layer 91 can be reduced; therefore, it is possible for sufficient thermal energy to be incident as far as the vicinity of the peripheries of the separating holes 14a (see FIG. 4a), and it is thus possible to form separating holes 14a, which are formed to the desired depth, up to the vicinity of the peripheries of the separating holes 14a. Accordingly, it is possible to reduce the overlapping width of neighboring separating holes 14a to 0% to 5%, inclusive, of the diameter of the separating holes, and in addition, it is possible to achieve a higher processing speed.

Figure 6:
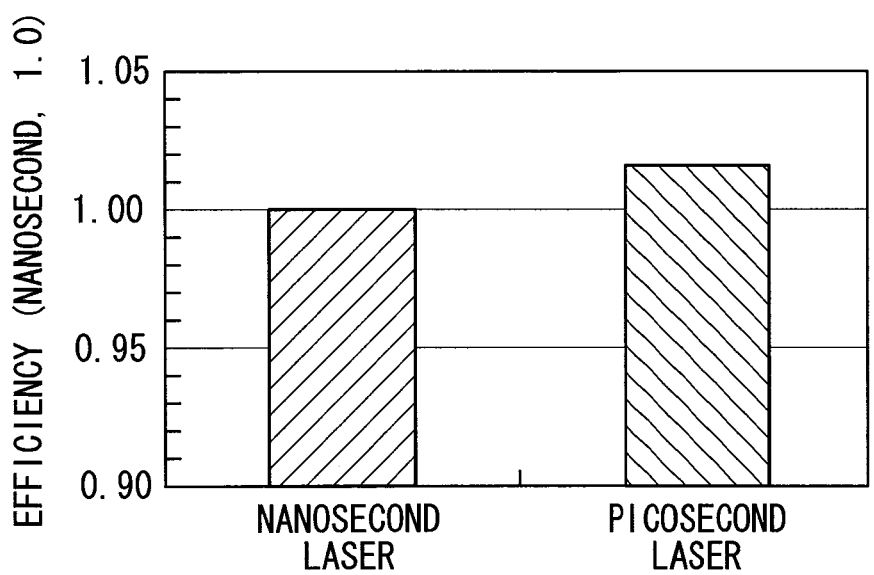
FIG. 6 is a graph showing the efficiencies of a solar cell module fabricated with a fabrication method according to this embodiment, and a solar cell module fabricated using a nanosecond pulsed laser, as a comparative example.

FIG. 6 shows the efficiency of a solar cell module fabricated by the fabrication method according to this embodiment, using a picosecond pulsed laser with a pulse width of 13 ps, and, as a comparative example, the efficiency of a solar cell module fabricated using a nanosecond pulsed laser with a pulse width of 15 ns, instead of the picosecond pulsed laser. As is clear from the figure, for a solar cell module with a power of 130 to 135 W, when the efficiency of the comparative example using the nanosecond pulsed laser is normalized to 1.0, the efficiency in this embodiment, using the picosecond pulsed laser, was improved by a factor of 1.02 (a 2% improvement).

The solar cell of this embodiment, shown in FIG. 1, has a tandem structure in which the electricity generating layers, formed of the first cell layer 91 and the second cell layer 92, are laminated in two layers. However, the present invention is not limited to a tandem structure; it may be widely applied to cases where silicon material is recrystallized during laser processing of an intermediate-contact-layer separating groove; for example, it may be used for a triple structure in which three electricity generating layers are laminated and intermediate contact layers are provided between individual electricity generating layers.

REFERENCE SIGNS LIST

1 GLASS SUBSTRATE
2 Transparent Electrode Layer
4 BACK ELECTRODE LAYER
5 POWER GENERATING CELL
10 SOLAR CELL (PHOTOELECTRIC CONVERSION DEVICE)
14 INTERMEDIATE CONTACT LAYER SEPARATING GROOVE
14A SEPARATING HOLE
91 TOP LAYER (FIRST PHOTOELECTRIC CONVERSION LAYER)
92 BOTTOM LAYER (SECOND PHOTOELECTRIC CONVERSION LAYER)
93 Intermediate Contact Layer

The invention claimed is:

1. A photoelectric conversion device fabrication method comprising:
a first photoelectric conversion layer film-formation step of film-forming a first photoelectric conversion layer having silicon as a main component;
an intermediate contact layer film-formation step of film-forming, on the first photoelectric conversion layer, an intermediate contact layer that is electrically and optically connected to the first photoelectric conversion layer;
an intermediate-contact-layer separating step of separating the intermediate contact layer by radiating laser light to remove the intermediate contact layer, forming an intermediate-contact-layer separating groove that reaches the first photoelectric conversion layer; and
a second photoelectric conversion layer film-formation step of film-forming, on the intermediate contact layer and inside the intermediate-contact-layer separating groove, a second photoelectric conversion layer having silicon as a main component and being electrically and optically connected to the intermediate contact layer,
wherein the intermediate-contact-layer separating step is performed with a pulsed laser having a pulse width of 10 ps to 750 ps, inclusive, and the intermediate-contact-layer separating groove terminates at an intermediate position in an i layer of the first photoelectric conversion layer.

2. A photoelectric conversion device fabrication method according to claim 1, wherein the intermediate-contact-layer separating step comprises a step of forming the intermediate-contact-layer separating groove continuously by partially overlapping a plurality of separating holes, and
the overlapping width of neighboring separating holes is 0% to 5%, inclusive, of the diameter of the separating holes.

* * * * *